United States Patent
Carter et al.

(10) Patent No.: US 10,638,604 B1
(45) Date of Patent: Apr. 28, 2020

(54) INSULATED METAL PRINTED CIRCUIT BOARD

(71) Applicant: BorgWarner, Inc., Auburn Hills, MI (US)

(72) Inventors: Jeffrey Carter, Mirfield (GB); Lathom Alexander Louco, Arden, NC (US)

(73) Assignee: BORGWARNER, INC., Auburn Hills, MI (US)

( * ) Notice: Subject to any disclaimer, the term of this patent is extended or adjusted under 35 U.S.C. 154(b) by 0 days.

(21) Appl. No.: 16/445,953

(22) Filed: Jun. 19, 2019

(51) Int. Cl.
*H05K 1/00* (2006.01)
*H05K 1/05* (2006.01)
*H05K 1/02* (2006.01)
*H05K 1/18* (2006.01)

(52) U.S. Cl.
CPC ........... *H05K 1/053* (2013.01); *H05K 1/0228* (2013.01); *H05K 1/181* (2013.01); *H05K 2201/0175* (2013.01); *H05K 2201/0191* (2013.01); *H05K 2201/0792* (2013.01); *H05K 2201/10015* (2013.01); *H05K 2201/10166* (2013.01)

(58) Field of Classification Search
USPC .......................................................... 361/748
See application file for complete search history.

(56) References Cited

U.S. PATENT DOCUMENTS

| | | | |
|---|---|---|---|
| 4,496,793 A | 1/1985 | Hanson et al. | |
| 5,266,746 A | 11/1993 | Nishihara et al. | |
| 9,035,343 B2 | 5/2015 | Zhang | |
| 9,277,639 B2 | 3/2016 | Kato et al. | |
| 2008/0054457 A1* | 3/2008 | Lin | H01L 24/13 257/737 |
| 2010/0319968 A1* | 12/2010 | Yao | C25D 11/04 174/257 |
| 2015/0118391 A1 | 4/2015 | Kilhenny | |
| 2015/0226772 A1* | 8/2015 | Kreikebaum | G01R 15/202 324/244 |
| 2015/0325764 A1 | 11/2015 | Rantala | |
| 2016/0211051 A1 | 7/2016 | Kim et al. | |
| 2017/0047280 A1 | 2/2017 | Tanaka et al. | |
| 2018/0086472 A1 | 3/2018 | Gore | |
| 2018/0179887 A1 | 6/2018 | Clarkson | |

FOREIGN PATENT DOCUMENTS

WO 2017/163077 A1 9/2017

* cited by examiner

*Primary Examiner* — Andargie M Aychillhum
(74) *Attorney, Agent, or Firm* — Reising Ethington P.C.

(57) ABSTRACT

A printed circuit board (PCB) includes a first aluminum layer, having a first thickness, electrically insulated with a coating of alumina applied to a surface of the first aluminum layer; a second aluminum layer, having a second thickness that is different than the first thickness, insulated with a coating of alumina applied to a surface of the second aluminum layer; and a conductive layer bonded to the coating of alumina on the first aluminum layer, the coating of alumina on the second aluminum layer, or both.

20 Claims, 2 Drawing Sheets

INSULATED METAL PRINTED CIRCUIT BOARD

TECHNICAL FIELD

The present application relates to printed circuit boards (PCBs) and, more particularly, to a PCB having an insulated aluminum substrate or layer.

BACKGROUND

PCBs are used to uniformly create conductive electrical circuits and also physically support a variety of electrical components used to implement the circuits. PCBs include a stack of alternating conductive layers and insulating layers, which facilitate placing one or more circuits on top of other circuits. During fabrication, a conductive layer can be etched to form the electrical circuit(s) and then bonded to an insulating layer or substrate. Additional conductive layers and insulating layers can then be added to the stack depending on the quantity of additional circuits that will be added to the PCB.

The type and thickness of material used for the insulating layer can influence the thickness and other performance characteristics of the PCB. It would be helpful to reduce the thickness of the insulating layer to minimize the height of the stacked layers while maintaining adequate heat dissipation characteristics.

SUMMARY

In one implementation, a printed circuit board (PCB) includes a first aluminum layer, having a first thickness, electrically insulated with a coating of alumina applied to a surface of the first aluminum layer; a second aluminum layer, having a second thickness that is different than the first thickness, insulated with a coating of alumina applied to a surface of the second aluminum layer; and a conductive layer bonded to the coating of alumina on the first aluminum layer, the coating of alumina on the second aluminum layer, or both.

In another implementation, a PCB includes an aluminum layer electrically insulated with a coating of alumina applied to a surface of the aluminum layer; a first conductive layer bonded to the alumina of the aluminum layer; and an electrical circuit formed in the first conductive layer, wherein one or more electrical conductors included in the first conductive layer are separated from a second conductive layer by the aluminum layer, such that a magnitude of a first magnetic field created by the electrical conductors in the first conductive layer is reduced by a magnetic field created by electrical conductors in the second conductive layer.

In yet another implementation, a first aluminum layer electrically insulated with a coating of alumina applied to a surface of the first aluminum layer; a first conductive layer bonded to the coating of alumina on the first aluminum layer; a second aluminum layer electrically insulated on one side with a coating of alumina and another side with a coating of alumina; a second conductive layer bonded to the second aluminum layer; and a glass-reinforced epoxy layer bonded to the second conductive layer.

DETAILED DESCRIPTION

Figure 1:
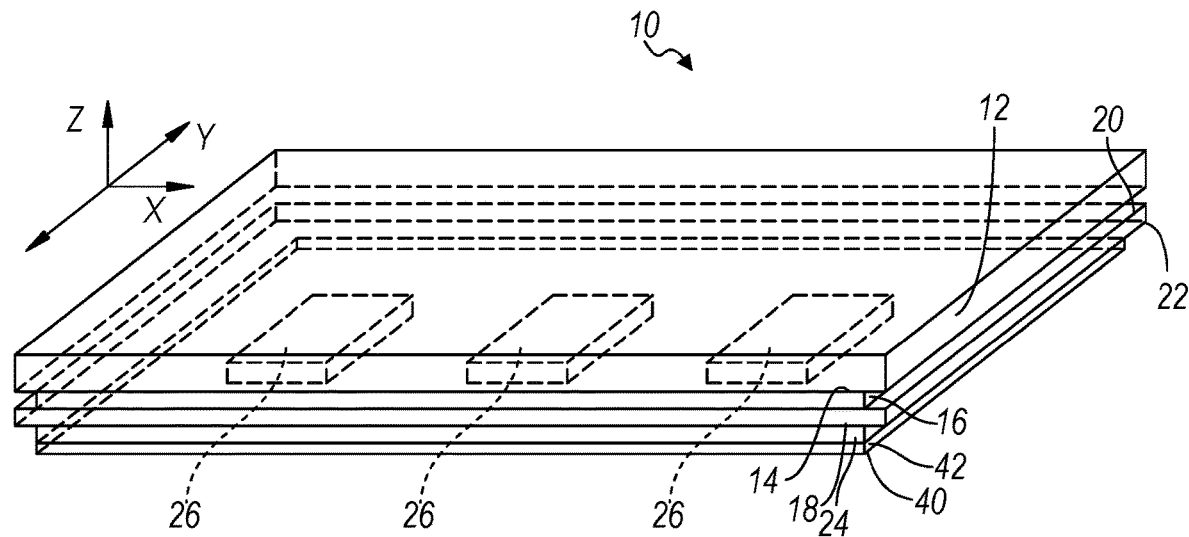
FIG. 1 is a perspective view depicting an implementation of a printed circuit board (PCB) having alumina-coated aluminum layers.

A printed circuit board (PCB) design uses one or more layers of aluminum coated with alumina acting as a dielectric to insulate the aluminum layers from the conductive layer(s). The coating of electrically-isolating alumina is formed on at least one surface of the aluminum layer(s). The PCB can include only layers of alumina-coated aluminum and conductive layers or the PCB can include substrate layers of glass-reinforced epoxy (e.g., FR4) in addition to layers of alumina-coated aluminum and conductive layers.

In contrast, past aluminum substrates of a PCB could include an organic dielectric layer, such as polyimide, or an anodized or nitrided dielectric that insulates the aluminum layer from a conductive layer. However, these dielectric layers are relatively thick when compared with the thickness of an alumina layer. The increased thickness of organic dielectrics or anodized/nitride surfaces can increase the stack height of the PCB and/or decrease the ability of the PCB to conduct heat. Instead, an alumina layer applied as an electric insulator to an aluminum layer is thinner than other dielectric layers used between conductive layers and aluminum substrates. The alumina layer can be free of pores therefore having better electrically insulating capability and better heat conduction per unit area than other dielectric layers. The increase in heat conductivity of the alumina-coated aluminum layer can increase heat extraction from the conductive layer to the aluminum layer thereby increasing the amount of current that electrical circuits included on the PCB are able to receive when compared to PCBs using past dielectric layers. The reduction in thickness of the PCB using alumina-coated aluminum layers can reduce the size of a switching circuit and also reduce the inductance of the circuit thereby increasing the switching frequency or speed at which the circuit is able to change or respond.

PCBs can have an alumina-coated aluminum layer and a conductive layer bonded together yet electrically isolated from each other by the alumina. In other implementations, the aluminum layer can be coated with alumina on one side and also coated with alumina on another, opposite facing side. Conductive layers, made of copper for example, can each be bonded to the alumina-coated sides of the aluminum layer. Other implementations are possible that incorporate glass-reinforced epoxy layers as well. For instance, PCB implementations in which the aluminum layer is coated with alumina on one side and also coated with alumina on another, opposite facing side, having conductive layers, made of copper for example, bonded to the alumina-coated sides of the aluminum layer can include a glass-reinforced epoxy layer bonded to a surface of one conductive layer and another glass-reinforced epoxy layer bonded to a surface of the other conductive layer. In addition, the thickness of the aluminum layer(s) and the conductive layers can be varied depending on the application. For instance, the aluminum layer and the conductive layer can be very thin such that that the shape of the PCB can be changed to conform to a physical housing that carries the PCB. Alternatively, the aluminum layer may be relatively thick to maximize heat insulation.

Figure 2:
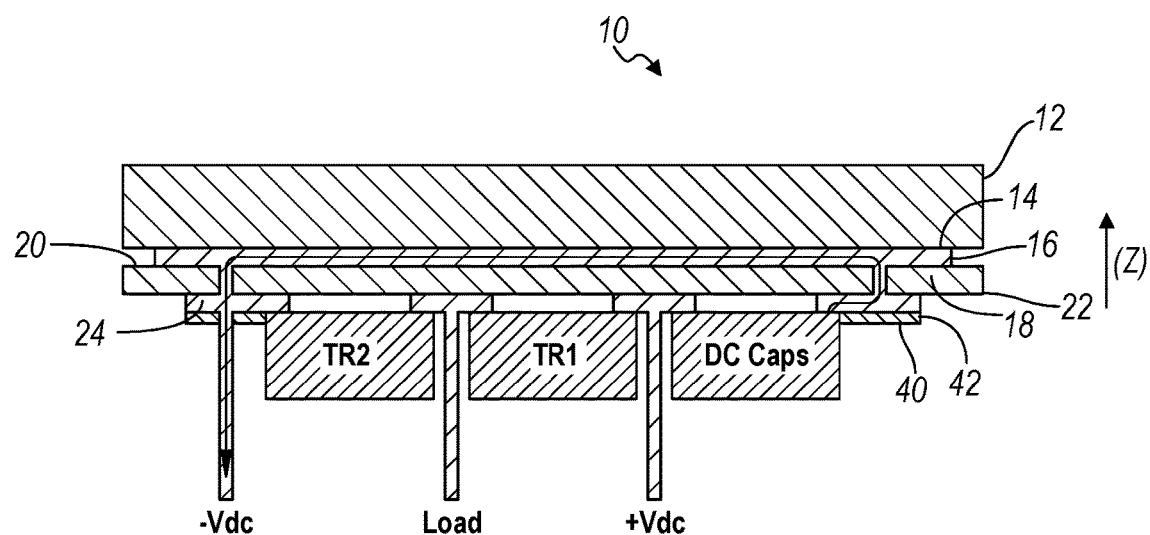
FIG. 2 is cross sectional view depicting an implementation of a PCB having alumina-coated aluminum layers.
Figure 3:
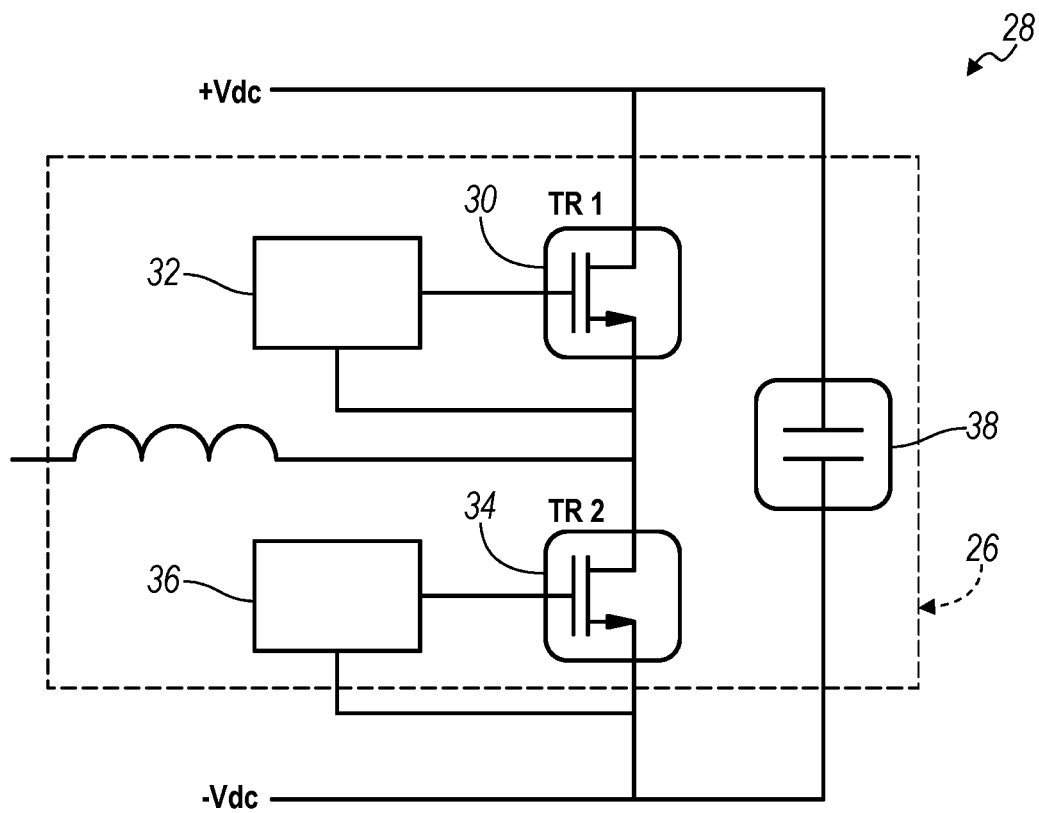
FIG. 3 is a schematic view depicting an implementation of an electrical circuit that can be included with the PCB.

Turning to FIGS. 1-3, an implementation of a PCB 10 is shown having an alumina-coated aluminum layer 12. FIG. 1 is a cross-sectional view of a portion of the PCB 10 having a first aluminum layer 12 with a first coating of alumina 14, a first conductive layer 16, a second aluminum layer 18 having a second coating of alumina 20 and a third coating of alumina 22, a second conductive layer 24, and electrical components 26 comprising an electrical circuit 28. The components 26 include a first switch 30, a first gate driver circuit 32, a second switch 34, a second gate driver circuit 36, and a capacitor 38. The electrical components 26 can be configured to control one or more phases of an electric motor used in an electrically-actuated turbocharger as is described in U.S. patent application Ser. No. 16/381,476, the entire contents of which are incorporated by reference. However, PCBs incorporating alumina-coated aluminum layers can be configured to implement many other different circuit designs and electrical components.

The PCB 10, as shown in FIG. 2, includes a silk screen 40, a solder mask 42, and the first aluminum layer 12 with the first coating of alumina 14 facing toward the conductive layer 16. The first aluminum layer 12 can be thicker than the second aluminum layer 18 and act as a heat sink for the PCB 10. One side of the PCB 10 can be cooled by a cooling channel (not shown) that abuts the first aluminum layer 12 and passes cooled liquid past a surface of the layer 12. The first aluminum layer 12 can transmit heat from the PCB 10 through a surface of the layer 12, the ends of the layer 12, or both. In one implementation, the first aluminum layer 12 and the first alumina coating 14 (also referred to as aluminum oxide) may be implemented by a substrate called Nanotherm™ manufactured by Cambridge Nanotherm Limited based in the United Kingdom. The first coating of alumina 14 is formed in a thin layer (approximately 15-30 micrometers (μm)) on one surface of the first aluminum layer 12. The alumina coating 14 can be applied to any aluminum surface and aluminum layers could vary in thickness from 15 μm to tens of millimeters (mm). The alumina can be produced by a liquid chemical process in which the aluminum layer is immersed in a chemical solution. The first conductive layer 16 can be bonded to the first alumina coating 14 of the first aluminum layer 12 using any one of a variety of techniques, such as the use of an organic adhesive or a high-temperature chemical diffusion bonding process that can be referred to as direct metallization. The first alumina coating 14 electrically insulates the first aluminum layer 12 from the first conductive layer 16.

The second aluminum layer 18 can have the second coating of alumina 20 on one side and a third coating of alumina 22 on another side of the layer 18. The second aluminum layer 18 can be bonded to the first conductive layer 16 using the bonding techniques described above, having the second alumina coating 20 separating and electrically insulating the second aluminum layer 18 from the first conductive layer 16. And a second conductive layer 24 can be bonded to the second aluminum layer 18 such that the third alumina coating 22 separates and electrically insulates the second aluminum layer 18 from the second conductive layer 24. The first conductive layer 16 and the second conductive layer 24 can form the electrically-conductive pathways or electrical conductors that comprise the electrical circuit 28. In this embodiment, the second aluminum layer 18 can be approximately 50 μm, thereby separating the first conductive layer 16 and the second conductive layer 24 by this distance.

The first switch 30, the first gate driver circuit 32, the second switch 34, the second gate driver circuit 36, and the capacitor 38 can be electrically linked through a circuit trace or electrical conductors that passes through the first conductive layer 16 and the second conductive layer 24 and forms the electrical circuit 28. The first switch 30 and the second switch 34 can each be implemented as a Metal Oxide Field Effect Transistor (MOSFET), a Binary Junction Transistor (BJT), or other similar transistor as is known in the art. The switches 30, 34 can include a supply, a gate, a drain, and a ground. An output of the first gate driver circuit 32 can be electrically connected to the gate of the first switch 30 and the output of the second gate driver circuit 36 can be electrically connected to the gate of the second switch 34. The capacitor 38 is electrically connected in parallel between the supply of the first switch 30 and the drain of the second switch 34. Windings of an electrical motor of an electrically-actuated turbocharger can be electrically connected to the source of the first switch 30 and the drain of the second switch 34.

The electrical conductors etched out of the first conductive layer 16 can be positioned directly above or near in the z-direction the electrical conductors of the second conductive layer 24 and current can flow through the electrical conductors of the first conductive layer 16 in one direction and through the electrical conductors of the second conductive layer 24 in another direction. Current following through the electrical conductors in opposite directions separated by a relatively small amount, such as <100 μm, can result in a magnetic field from the electrical conductors in the first conductive layer 16 that largely overlaps a magnetic field from the electrical conductors in the second conductive layer 24 yet the magnetic fields have opposite polarities thereby cancelling or minimizing the strength of the magnetic fields generated by the conductors in each conductive layer 16, 24. In contrast, if further apart, the magnetic fields could augment each other thereby increasing the magnetic field strength. As the width of the tracks increases and the separation between the conductors decreases, the more effectively the magnetic fields generated by the conductive layers 16, 24 can be cancelled. Circuit inductance (L) is related to an amount of energy stored in a magnetic field so if the magnetic fields largely cancel, inductance in the electrical pathways/conductors is small. The undesirable inductance associated with PCBs that is reduced or cancelled can be referred to as parasitic inductance. The parasitic inductance can cause increased voltages during switching events when a rate of change in current is high. The switches used can be rated to withstand an inductive overvoltage and reducing parasitic inductance can minimize the inductive overvoltage and, therefore, the power throughput for given component voltage and current ratings of the electrical components can be maximized.

Figure 4:
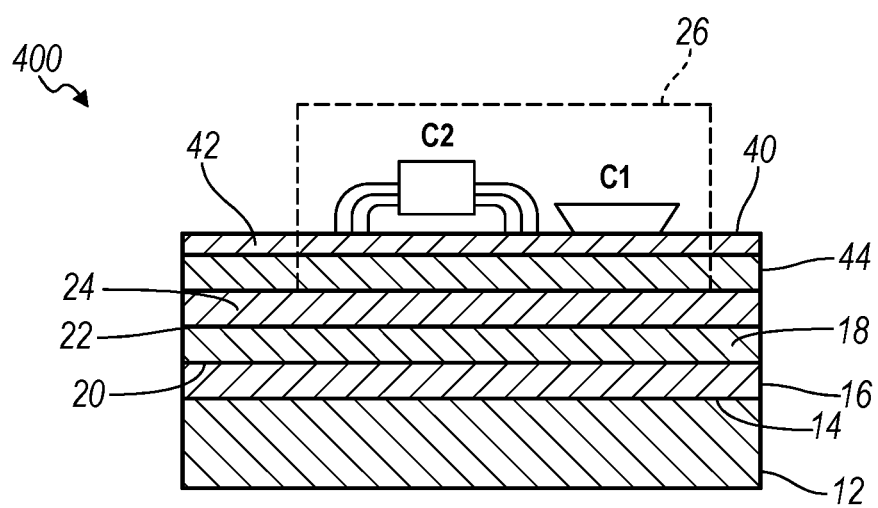
FIG. 4 is a cross-sectional view depicting another implementation of a PCB having alumina-coated aluminum layers.

Turning to FIG. 4, another implementation of a PCB 400 is shown. The PCB 400 includes alumina-coated aluminum layers, conductive layers, and glass-reinforced epoxy layers. The quantity of the alumina-coated aluminum layers, conductive layers, and glass-reinforced epoxy layers can vary in different implementations. Here, the PCB 400 includes a first aluminum layer 12, a first conductive layer 16, a second aluminum layer 18, a second conductive layer 24, and a glass-reinforced epoxy layer 44. The first aluminum layer 12 includes a first coating of alumina 14 on a surface of the first aluminum layer 12 that faces the first conductive layer 16 and the second aluminum layer 18 can include a second and third coating of alumina 20, 22 on the surfaces facing the first conductive layer 16 and the second conductive layer 18, respectively. The glass-reinforced epoxy layer 44 can be bonded to the second conductive layer 24. In this implementation, the first aluminum layer 12 can be relatively thicker than the second aluminum layer 18. For example, the first aluminum layer 12 can be approximately 1 millimeter (mm) thick and function as a heat sink for the PCB 400 drawing heat away from the first conductive layer 16, the second aluminum layer 18, and the second conductive layer 24. The second aluminum layer 18 can be between 15-130 µm, thereby positioning the conductive layers 16, 24 relatively near each other to cancel the magnetic fields generated by the electrical conductors of the first conductive layer 16 and the second conductive layer 24. The glass-reinforced epoxy layer 44 can, along with first aluminum layer 12, be used to add structural rigidity to the PCB 400 and include a silk screen 40 and a solder mask 42. A first switch, first gate driver circuit, a second switch, a second gate driver circuit, and capacitors (collectively indicated as electrical components 26) can be electrically linked through electrical conductors that pass through the first conductive layer 16 and the second conductive layer 24; the glass-reinforced epoxy layer 44 can physically support the first switch, the second switch, and the capacitors.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A printed circuit board (PCB), comprising:
a first aluminum layer, having a first thickness, electrically insulated with a coating of alumina applied to a surface of the first aluminum layer;
a second aluminum layer, having a second thickness that is different than the first thickness, insulated with a coating of alumina applied to a surface of the second aluminum layer; and
a conductive layer bonded to the coating of alumina on the first aluminum layer, the coating of alumina on the second aluminum layer, or both.

2. The PCB recited in claim 1, wherein the coating of alumina applied to the surface of the first aluminum layer or the coating of alumina applied to the surface of the second aluminum layer is between 15-30 micrometers.

3. The PCB recited in claim 1, wherein the first aluminum layer or the second aluminum layer is between 15 micrometers and 1 millimeter.

4. The PCB recited in claim 1, further comprising a glass-reinforced epoxy layer.

5. The PCB recited in claim 1, further comprising a third aluminum layer and a second conductive layer.

6. The PCB recited in claim 1, further comprising a plurality of electrical components electrically connected to the conductive layer.

7. The PCB recited in claim 6, wherein the electrical components further comprise a first switch and a second switch.

8. A printed circuit board (PCB), comprising:
an aluminum layer electrically insulated with a coating of alumina applied to a surface of the aluminum layer;
a first conductive layer bonded to the alumina of the aluminum layer; and
an electrical circuit formed in the first conductive layer, wherein one or more electrical conductors included in the first conductive layer are separated from a second conductive layer by the aluminum layer, such that a magnitude of a first magnetic field created by the electrical conductors in the first conductive layer is reduced by a magnetic field created by electrical conductors in the second conductive layer.

9. The PCB recited in claim 8, wherein the coating of alumina applied to the surface of the aluminum layer is between 15-30 micrometers.

10. The PCB recited in claim 8, wherein the aluminum layer is between 15 micrometers and 1 millimeter.

11. The PCB recited in claim 8, further comprising a glass-reinforced epoxy layer.

12. The PCB recited in claim 8, further comprising the second conductive layer.

13. The PCB recited in claim 8, further comprising a second aluminum layer.

14. The PCB recited in claim 8, further comprising a plurality of electrical components electrically connected to the first conductive layer.

15. The PCB recited in claim 14, wherein the electrical components further comprise a first switch and a second switch.

16. A printed circuit board (PCB), comprising:
a first aluminum layer electrically insulated with a coating of alumina applied to a surface of the first aluminum layer;
a first conductive layer bonded to the coating of alumina on the first aluminum layer;
a second aluminum layer electrically insulated on one side with a coating of alumina and another side with a coating of alumina;
a second conductive layer bonded to the second aluminum layer; and
a glass-reinforced epoxy layer bonded to the second conductive layer.

17. The PCB recited in claim 16, wherein the coating of alumina applied to the surface of the first aluminum layer or the coatings of alumina on the second aluminum layer is between 15-30 micrometers.

18. The PCB recited in claim 16, wherein the first aluminum layer or the second aluminum layer is between 15 micrometers and 1 millimeter.

19. The PCB recited in claim 16, further comprising a plurality of electrical components electrically connected to the first conductive layer and the second conductive layer.

20. The PCB recited in claim 19, wherein the electrical components further comprise a first switch and a second switch.

* * * * *